US008351891B2

(12) United States Patent
Heydari et al.

(10) Patent No.: US 8,351,891 B2
(45) Date of Patent: Jan. 8, 2013

(54) WIDEBAND DISTRIBUTED MIXERS

(75) Inventors: Payam Heydari, Irvine, CA (US);
Ahmad Yazdi, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 931 days.

(21) Appl. No.: 10/856,616

(22) Filed: May 28, 2004

(65) Prior Publication Data

US 2005/0064840 A1  Mar. 24, 2005

Related U.S. Application Data

(60) Provisional application No. 60/475,014, filed on May 30, 2003.

(51) Int. Cl.
*H04B 1/28* (2006.01)
(52) U.S. Cl. ......... 455/333; 455/326; 455/320; 455/282
(58) Field of Classification Search .......... 455/313–333, 455/282, 189.1, 118, 209, 293
See application file for complete search history.

(56) References Cited

U.S. PATENT DOCUMENTS

| | | | | |
|---|---|---|---|---|
| 4,660,006 A | * | 4/1987 | Tajima et al. ................ | 333/218 |
| 4,662,000 A | * | 4/1987 | Tajima et al. ................ | 455/333 |
| 4,675,911 A | * | 6/1987 | Sokolov et al. ............. | 455/325 |
| 4,709,410 A | * | 11/1987 | Tajima et al. ................ | 455/333 |
| 4,751,744 A | * | 6/1988 | Pavio, Jr. .................... | 455/333 |
| 4,896,374 A | * | 1/1990 | Waugh et al. ................ | 455/326 |
| 4,994,755 A | * | 2/1991 | Titus et al. .................. | 330/54 |
| 5,060,298 A | * | 10/1991 | Waugh et al. ................ | 455/326 |
| 5,136,720 A | * | 8/1992 | Titus et al. .................. | 455/323 |
| 5,265,267 A | * | 11/1993 | Martin et al. ................ | 455/326 |
| 5,448,772 A | * | 9/1995 | Grandfield .................. | 455/333 |
| 5,678,225 A | * | 10/1997 | Kobayashi ................... | 455/330 |
| 5,809,409 A | * | 9/1998 | Itoh et al. .................... | 455/327 |
| 5,983,089 A | * | 11/1999 | Mohwinkel et al. ......... | 455/323 |
| 6,026,286 A | * | 2/2000 | Long .......................... | 455/327 |
| 6,122,497 A | * | 9/2000 | Gilbert ....................... | 455/333 |
| 6,125,272 A | * | 9/2000 | Bautista et al. ............. | 455/326 |
| 6,160,425 A | * | 12/2000 | Laurent et al. .............. | 327/113 |
| 6,653,885 B2 | * | 11/2003 | Wu et al. .................... | 327/356 |
| 6,807,407 B2 | * | 10/2004 | Ji ............................... | 455/326 |
| 6,810,242 B2 | * | 10/2004 | Molnar et al. ............... | 455/326 |
| 6,871,057 B2 | * | 3/2005 | Ugajin et al. ................ | 455/323 |

(Continued)

OTHER PUBLICATIONS

M.Lacon, K.Nakano, G.S.Dow, "A Wide Band Distributed Dual Gate HEMT Mixer," GaAs IC Symposium Digest, pp. 173-176, 1988).

(Continued)

*Primary Examiner* — Edward Urban
*Assistant Examiner* — Rui Hu
(74) *Attorney, Agent, or Firm* — Dickstein Shapiro LLP; Kenneth S. Roberts

(57) ABSTRACT

A wideband distributed mixer capable of operation over a wide range of frequencies is provided. The mixer can include a plurality of N mixer stages and monolithic transmission lines integrated together on a common semiconductor substrate. The length of each transmission line between adjacent stages can be predetermined such that an IF signal output from each stage is in-phase with the IF signal output from any preceding stage, allowing the mixer to output a mixed IF signal that is a constructive sum of the IF output signals from each constituent stage. The number of mixer stages as well as the design architectures and topologies for each stage can be varied according to the needs of the application.

6 Claims, 14 Drawing Sheets

U.S. PATENT DOCUMENTS

| | | | |
|---|---|---|---|
| 7,020,450 B2* | 3/2006 | Desclos | 455/313 |
| 7,120,414 B2* | 10/2006 | Kim et al. | 455/313 |
| 7,279,980 B2* | 10/2007 | Heydari et al. | 330/286 |
| 7,417,486 B2* | 8/2008 | Koutani et al. | 327/359 |
| 7,509,112 B2* | 3/2009 | Fujii | 455/327 |
| 7,512,394 B2* | 3/2009 | Fujii | 455/327 |
| 2001/0021645 A1* | 9/2001 | Ugajin et al. | 455/333 |
| 2002/0032016 A1* | 3/2002 | Ji | 455/326 |
| 2003/0064696 A1* | 4/2003 | Akamine et al. | 455/311 |
| 2003/0216131 A1* | 11/2003 | Kovacevic et al. | 455/326 |
| 2004/0063419 A1* | 4/2004 | Molnar et al. | 455/323 |
| 2004/0229591 A1* | 11/2004 | Jurek | 455/315 |
| 2005/0014476 A1* | 1/2005 | Oono et al. | 455/118 |
| 2008/0102778 A1* | 5/2008 | Shen | 455/323 |
| 2010/0271266 A1* | 10/2010 | Lai et al. | 343/700 MS |

OTHER PUBLICATIONS

K.L.Deng, H.Wang, "A 3-33GHz PHEMT MIMIC Distributed Mixer," IEEE RF Integrated Circuits Symposium, pp. 151-154, 2002).

Majidi-Ahy et al., "*23-40 Ghz InP HEMT MMIC Distributed Mixer*", IEEE MTT-S Digest (1992), pp. '063-1066.

Hellig et al., "*A Monolithic Integrated HEMT Frontend in CPW Technology from 10-50 GHz for Measurement Systems for Broadband ReceiversI*", IEEE MTT-S Digest (1995), pp. 211-214.

Simion et al., "*Distributed Mixer for Doppler Applications*", Third International Workshop on Integrated Nonlinear Microwaves and Millimeterwave Circuits (Oct. 1994), pp. 253-258.

Darsinooieh et al., "*On the Theory and Design of Subharmonically Drain Pumped Microwave Mesfet Distributed Mixers*", Eighth Mediterranean Electrotechnical Conference (1996), pp. 595-598.

Ang et al., "*Multiple-FET Mixer Analysis with Applications to the Cascode Distributed Mixer*", High Frequency Post Graduate Student Colloquium (1999), pp. 22-27.

Fairburn et al., "*A Novel Monolithic Distributed Mixer Design*", IEE Colloquium on on Microwave and Micrometre Wave Monolithic Integrated Circuits (Nov. 1988), pp. 13/1-13/6.

Titus et al., "*I2-26 GHz MMIC Frequency Converter*", Technical Digest GaAs IC Symposium (Nov. 1988), pp. 181-184.

Robertson et al., "*Multi-Octave MMIC Distributed Mixers*", IEE Colloquium on Multi-Octave Microwaves Circuits (Nov. 1991), pp. 4/1-4/7.

LaCon et al., "*A Wide Band Distributed Duel Gate HEMT Mixer*", IEEE, GaAs IC Symposium, 1988, pp. 173-176.

Kuo-Liang Deng et al., "*A 3-33 GHz PHEMT MMIC Distributed Drain Mixer*", IEEE Radio Frequency Integrated Circuits Symposium, 2002, pp. 151-154.

\* cited by examiner

WIDEBAND DISTRIBUTED MIXERS

CROSS-REFERENCE TO RELATED APPLICATIONS

This application claims the benefit of U.S. Provisional Application No. 60/475,014, filed May 30, 2003, which is incorporated herein by reference.

FIELD OF THE INVENTION

The present invention relates generally to mixers for use in wireless applications, and more particularly to distributed wideband mixers capable of operation over a broad frequency range.

BACKGROUND OF THE INVENTION

Mixers are commonly used throughout the wireless industry to mix a radio frequency (RF) signal with a lower frequency local oscillator (LO) signal to produce an intermediate frequency (IF) signal. Mixers can generally be classified as either narrowband or wideband mixers, with the difference being the breadth of the RF range over which the mixer can operate. Wideband mixers are used across numerous wireless applications and standards, one example of which includes ultra wide-band (UWB) wireless systems.

UWB wireless broadcasts are capable of carrying huge amounts of data up to 250 feet with extremely little transmit power and high immunity to interference and noise. UWB wireless receivers are able to highly resolve signals in multi-path fading channels due to the nature of the short duration transmitting impulse signals. This capability, coupled with the spread spectrum characteristics of UWB wireless systems, make UWB systems desirable for use in a wide variety of high-rate, short- to medium-range communications. The additional ability to locate objects to within one inch attracts military, law-enforcement, and rescue agencies. Other UWB applications include broadband sensing using active sensor networks and collision-avoidance systems.

For instance, the FCC has opened a 3.1-10.6 GHz unlicensed band for UWB communication systems. The power mask within this frequency range is much lower (−41.3 dBm) than other wireless radio channels. Two different approaches to UWB system design have been proposed: (1) single-band impulse radio and (2) multi-band radio. The multi-band approach includes many stringent requirements that challenges the design of the RF frond-end blocks, including frequency synthesizers on both the transmitter and receiver sides, as well as low noise amplifiers (LNAs) and mixers on the receiver side with bandwidths in excess of 500 MHz.

The circuit techniques used to realize different circuit components in a UWB transceiver are typically different from those used in current narrow bandwidth RF technology. This allows the design of new circuit topologies that operate at substantially higher frequencies than conventional circuits, such as distributed circuits. Distributed integrated circuits, such as distributed amplifiers and oscillators, employ actual or artificial monolithic transmission lines, i.e., transmission lines placed directly within the integrated circuit, or "on-chip," in order to achieve higher frequencies by trading delay for bandwidth.

Delay is more tolerable in wideband systems than in narrowband systems because the delay can be calibrated using the delay prediction circuits. Accordingly, distributed circuit topologies have extended into the design of wideband mixers. These mixers use single-ended architectures fabricated with expensive semiconductor processes such as GaAs and other III-V technologies. These single-ended architectures are prone to failure at ultra high frequencies due to integrated circuit noise. One such design employs a dual gate distributed mixer in high electron mobility transistor (HEMT) technology (see M. Lacon, K. Nakano, G. S. Dow, "A Wide Band Distributed Dual Gate HEMT Mixer," GaAs IC Symposium Digest, pp. 173-176, 1988). This design uses dual gate transistors to provide the RF and LO signal paths, and thus exhibits a poor return loss.

Another wideband distributed mixer design is fabricated in a Gallium Arsenide (GaAs) pseudomorphic HEMT (PHEMT) technology (see K. L. Deng, H. Wang, "A 3-33 GHz PHEMT MIMIC Distributed Mixer," IEEE RF Integrated Circuits Symposium, pp. 151-154, 2002). However, this design suffers from a lower conversion gain, high susceptibility to the environmental noise such as inductive noise from the package and power/ground bounce, and high power consumption. Most importantly, the mixer operation is achieved under a precisely equal LO and RF amplitude, which is a severe limitation of the proposed circuit.

Accordingly, improved mixer designs capable of ultra wideband operation with improved conversion gain, lowered noise susceptibility and power consumption, relaxed input signal requirements, lowered fabrication costs and other such advantages are needed.

SUMMARY

A wideband distributed mixer is provided that is capable of operation over a wide range of frequencies suitable for numerous applications, such as UWB systems and the like. In one exemplary embodiment, the mixer is fabricated in a complementary metal-oxide-semiconductor (CMOS) process and includes a plurality of CMOS mixer stages, each configured to mix an RF signal with an LO signal and output a mixed IF signal. The mixer also includes a plurality of monolithic transmission lines configured to provide the RF and LO signals to each stage and output the mixed IF signal from each stage, where the mixer stages and transmission lines are integrated on a common semiconductor substrate.

In another exemplary embodiment, the mixer includes a plurality of mixer stages, each stage having an RF input, a differential LO input and a differential IF output, and each stage is configured to mix an RF signal with a differential LO signal and output a mixed differential IF signal. The mixer also includes a first transmission line coupled with the RF input of each stage at a first connection node, a second and a third transmission line coupled with the differential LO input of each stage at a second and a third connection node, respectively, and a fourth and a fifth transmission line coupled with the differential IF output of each stage at a fourth and a fifth connection node, respectively, for outputting the mixed IF signal from each stage. The fourth and fifth transmission lines are also coupled with a differential IF output terminal. In this embodiment, the length of each transmission line between adjacent connection nodes is predetermined such that the mixed IF signal output from each stage at the respective connection node is substantially in-phase with the mixed IF output signal propagating from any preceding stage.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims. It is also intended that the invention is not limited to the require the details of the example embodiments.

BRIEF DESCRIPTION OF THE FIGURES

The details of the invention, both as to its structure and operation, may be gleaned in part by study of the accompanying figures, in which like reference numerals refer to like parts. The components in the figures are not necessarily to scale, emphasis instead being placed upon illustrating the principles of the invention. Moreover, all illustrations are intended to convey concepts, where relative sizes, shapes and other detailed attributes may be illustrated schematically rather than literally or precisely.

DETAILED DESCRIPTION

The wideband distributed mixer provided herein incorporates multiple mixer stages together with monolithic transmission lines to achieve operation over a wide RF range. This wideband distributed mixer is preferably fabricated in an inexpensive digital semiconductor process, such as complementary metal-oxide-semiconductor (CMOS) processes and the like, allowing full integration with digital RF transceivers and other digital processing circuitry. The wideband capabilities of the mixer make it suitable for numerous wideband applications including UWB systems.

Figure 1:
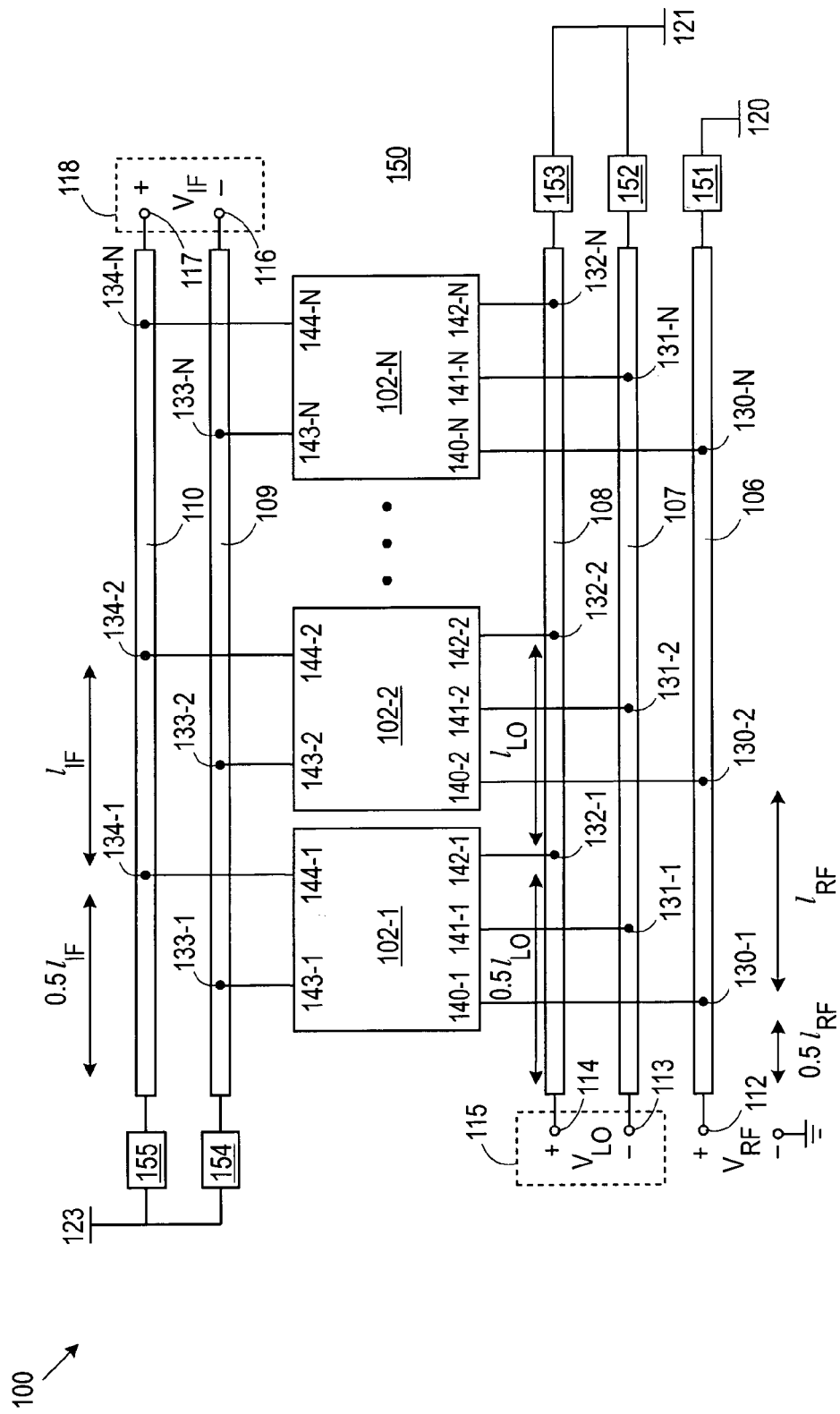
FIG. 1 is a block diagram of one exemplary embodiment of an N-stage differential mixer.

FIG. 1 depicts a preferred exemplary embodiment of a differential wideband distributed mixer 100. Mixer 100 can include one or more of mixer stages 102. Here, mixer 100 includes a sequence of N constituent mixer stages 102, each being referenced according to it's position in the sequence. For instance, mixer stage 102-1 is the first mixer stage 102 in the sequence and is located furthest from IF output terminal 118, mixer stage 102-2 is the second mixer stage in the sequence as is located adjacent to mixer stage 102-1 closer to IF output terminal 118 and so forth up to mixer stage 102-N, which is the nth mixer stage 102 in the sequence and located closest to IF output terminal 118.

To facilitate the design of mixer 100, each stage is preferably designed to be substantially identical, however variations between stages 102 can be made in accordance with the needs of the application. Also, mixer stages 102 can be implemented in any desired topology or architecture as needed by the application, and is not limited to any one implementation described herein. In this embodiment, each mixer stage 102 is preferably a lumped active mixer, such as a single-balanced or double-balanced circuit.

The RF and LO input signals and the IF output signal can each be provided over monolithic transmission lines 106-110. Transmission lines 106-110 preferably have a negligible loss, such that the characteristic impedance of each transmission line 106-110 is substantially frequency invariant over the desired wide range of frequencies. The substantial frequency invariability provides several advantages such as allowing distributed mixer 100 to achieve wideband input/output matching.

The RF signal, $V_{RF}$, which can be a received RF signal, is provided to input node 112 at a first end of transmission line 106, the other end being coupled with RF bias source 120 via matched termination load 151, preferably having an impedance matching the characteristic impedance $Z_{RF,c}$ of line 106. In this embodiment, the LO and IF signals are differential signals and mixer 100 is implemented in a differential architecture. The differential architecture is preferred to give mixer 100 robust performance in the presence of common-mode noise sources, such as inductive and capacitive cross-talk, power and ground noise and substrate noise.

The LO signal, $V_{LO}$, is provided to input terminal 115, which includes input nodes 113 and 114 of transmission lines 107 and 108, respectively. The opposite ends of transmission lines 107 and 108 are coupled with LO bias source 121 via matched termination loads 152 and 153, each preferably having an impedance matching the characteristic impedance $Z_{LO,c}$ of the respective lines 107 and 108. Although the acronym LO is used herein, referring to the term local oscillator, one of skill in the art will readily recognize that the LO signal can be produced in any manner and is not solely limited to generation with a local oscillator.

The IF signal, $V_{IF}$, is output from output terminal 118, which includes nodes 116 and 117 of transmission lines 109 and 110, respectively. The opposite ends of transmission lines 109 and 110 can be coupled with DC bias source 123, via matched termination loads 152 and 153, each preferably having an impedance matching the characteristic impedance $Z_{IF,c}$ of the respective lines 109 and 110.

Each stage 102 forms an IF component signal by multiplying the input signal VRF by VLO, which is preferably a periodic waveform with the period of TLO. The inputs 140-142 and outputs 143-144 of each stage 102 are coupled with transmission lines 106-110 at various connection nodes 130-134. Specifically, RF input 140 is coupled with transmission line 106 at connection node 130, LO inputs 141 and 142 are coupled with transmission lines 107 and 108 at nodes 131 and 132, respectively, and IF outputs 143 and 144 are coupled with transmission lines 109 and 110 at nodes 133 and 134, respectively.

The IF signal output from each stage 102 divides into two waves, one propagating in a forward direction towards IF output terminal 118 and the other propagating in a reverse direction towards matched termination loads 154 and 155.

Preferably, the lengths of transmission lines 106-110 between consecutive stages 102 ($l_{RF}$, $l_{LO}$, $l_{IF}$) are predetermined, or chosen, to allow the IF output signal from each stage 102 to be in-phase with the IF output signal of the forward traveling IF wave from other stages 102, i.e., to allow the forward traveling IF wave to constructively add with the IF output signal coming from each subsequent mixer stage 102. Also, the reverse-traveling waves are preferably out of phase and cancel each other out.

For instance, the forward traveling IF signal from output 144-1 of mixer stage 102-1 propagates along transmission line 110 towards mixer stage 102-2. The values of $l_{RF}$, $l_{LO}$ and $l_{IF}$ are predetermined to allow the forward traveling IF wave from stage 102-1 to be in-phase with the IF signal output from mixer stage 102-2 at connection node 134-2 so that the signals can constructively add together. As a result, the $V_{IF}$ signal present at the IF output terminal 118 is a sum of the N IF output signals from each stage 102. This constructive addition allows mixer 100 to achieve an improved conversion gain as compared with conventional mixers. Also, in addition to the differential architecture of mixer 100, this constructive addition technique allows the construction of mixer 100 in a relatively inexpensive semiconductor fabrication process, such as CMOS and the like, with improved conversion gain and frequency range.

Mixer 100 is preferably a distributed circuit with monolithic transmission lines 106-110 and mixer stages 102 fabricated on the same common semiconductor substrate 150. Preferably, mixer 100 is fabricated in a digital process, such as CMOS and the like. As mentioned above, CMOS processes are relatively inexpensive and facilitate integration of mixer 100 with other RF circuitry components and digital processing components. For instance, in one exemplary embodiment mixer 100 can be used as a down-mixer integrated with a digital CMOS UWB receiver.

Figure 2:
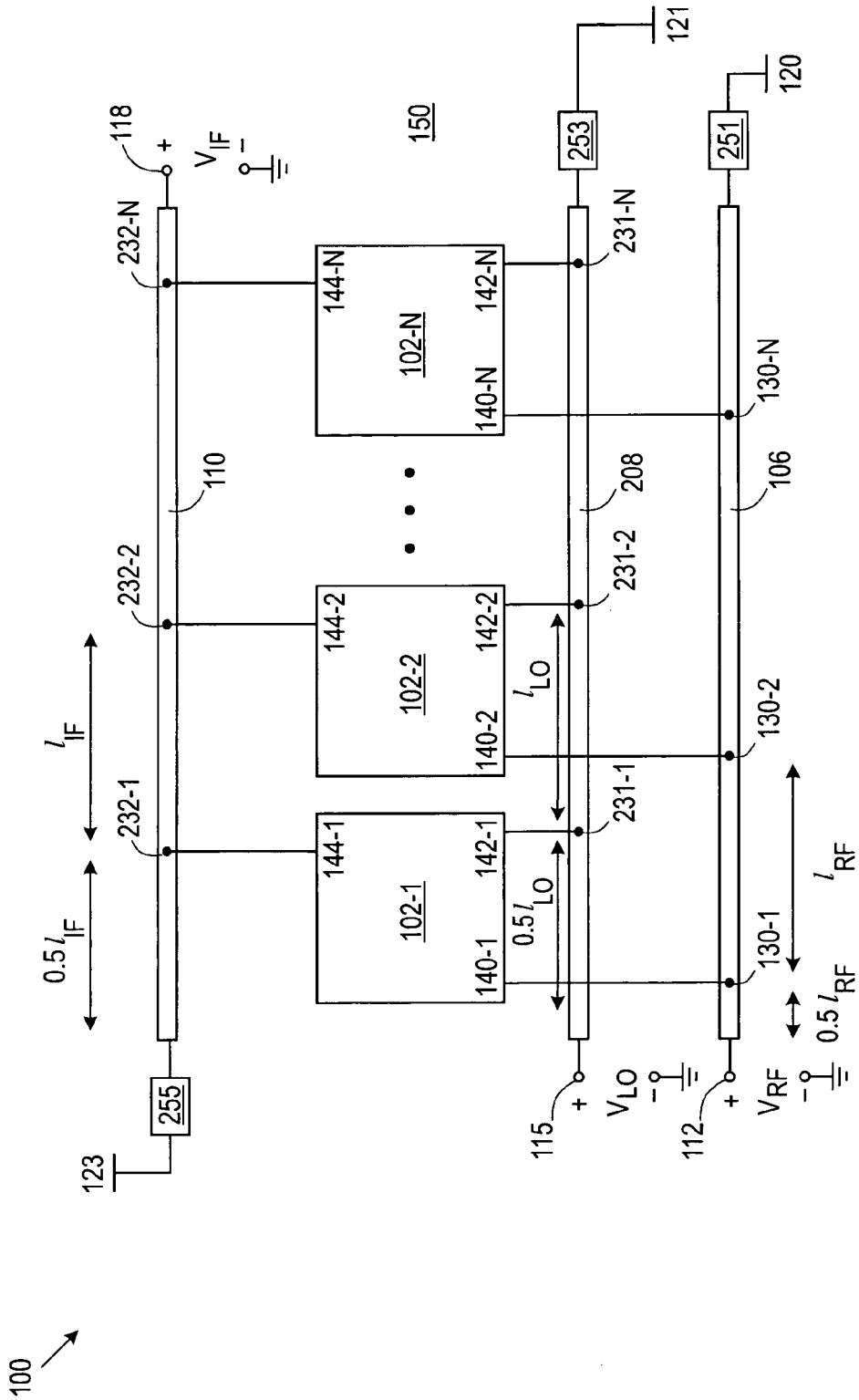
FIG. 2 is a block diagram of one exemplary embodiment of an N-stage single-ended mixer.

In another exemplary embodiment, mixer 100 can be implemented with a single-ended architecture as depicted in FIG. 2. Here, mixer 100 includes N mixer stages 102 and monolithic transmission lines 106, 208 and 210. Similar to the embodiment depicted in FIG. 1, each stage 102 is coupled with transmission line 106 for providing $V_{RF}$. However, in this embodiment the $V_{LO}$ and $V_{IF}$ signals are single-ended and each mixer stage 102 is configured accordingly. The LO input of each stage 102 is coupled with transmission line 208 at connection node 231 for providing the $V_{LO}$ signal and the IF output of each mixer stage 102 is coupled with transmission line 210 at connection node 232 for outputting the mixed IF component signal. Similar to the embodiment described with respect to FIG. 1, the length of each transmission line between consecutive stages 102 ($l_{RF}$, $l_{LO}$, $l_{IF}$) is predetermined to allow each IF signal output from each stage 102 to be in-phase with the forward traveling IF wave propagating along transmission line 210.

Figure 3:
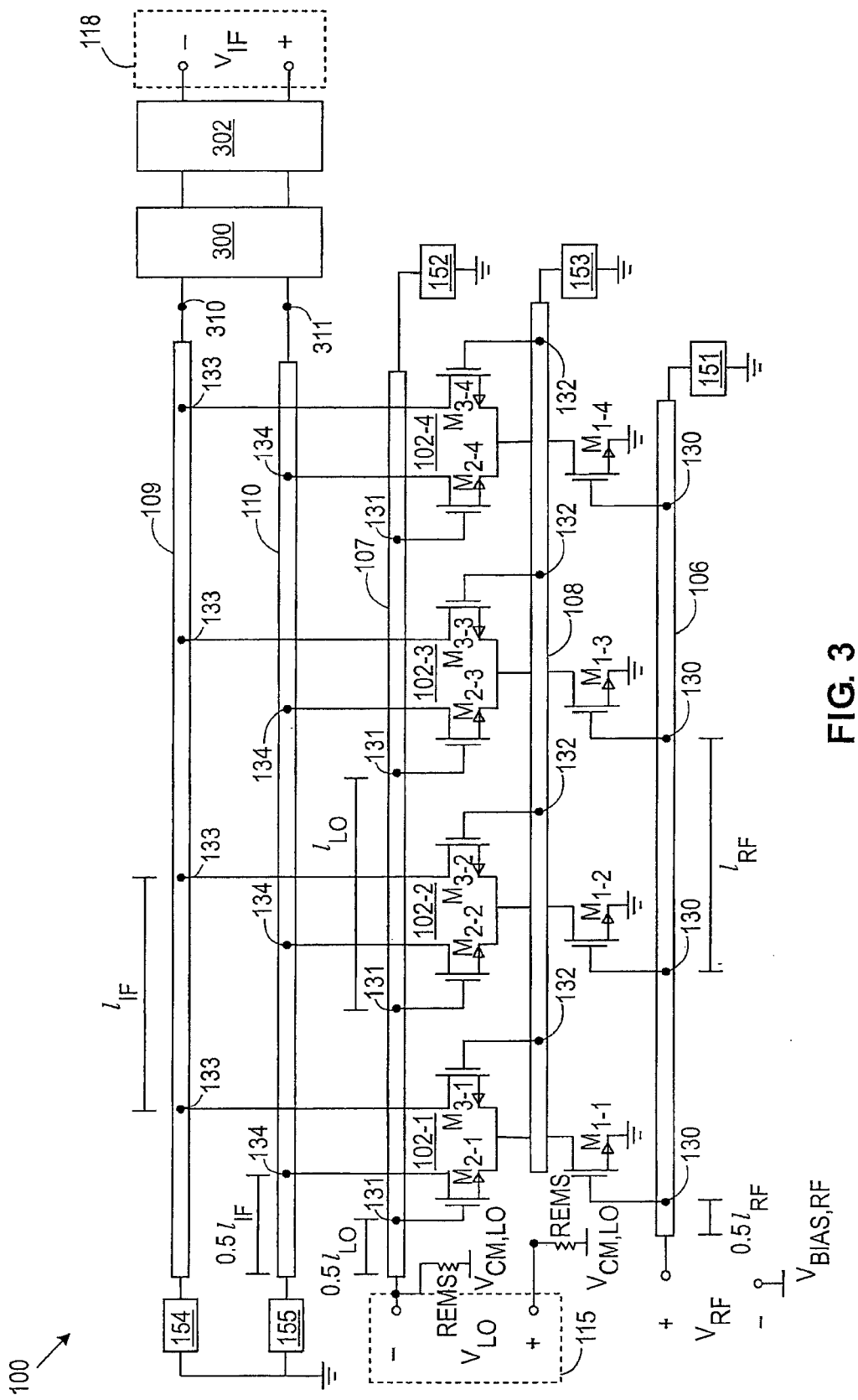
FIG. 3 is a schematic view of an exemplary embodiment of a four stage differential mixer.

FIG. 3 depicts an exemplary embodiment of a preferred four-stage wideband distributed mixer 100 implemented in a differential architecture. Here, each of the four mixer stages 102 is a single-balanced lumped active mixer, which provides robust performance in the presence of the common-mode noise. Similar to the embodiment described with respect to FIG. 1, the signals input to inputs 140-142 and output from outputs 143 and 144 of each stage 102 are preferably routed on monolithic transmission lines 106-110. The length of each transmission line between consecutive stages 102 is preferably predetermined to allow each IF signal output from each stage 102 to be in-phase with the forward traveling IF wave propagating along each transmission line 109-110. In this embodiment, mixer 100 is preferably fabricated in a CMOS process and all components of mixer 100 are preferably monolithically integrated on a single common semiconductor substrate 150.

Here, each mixer stage 102 includes three N-type field-effect transistors (NFETS) $M_1$, $M_2$ and $M_3$, where $M_2$ and $M_3$ form a differential pair and $M_1$ forms a current tail to the pair. Preferably, the current tail transistors $M_1$ in each stage are substantially identically matched and biased using a mirror current source bias circuitry. The differential pair transistors $M_2$ and $M_3$ preferably have the same geometry and biasing point. In each stage, the gate of $M_1$ is coupled with transmission line 107 at connection node 130 and the gates of $M_2$ and $M_3$ are coupled with transmission lines 107 and 108 at connection nodes 131 and 132, respectively. The sources of $M_2$ and $M_3$ are coupled with transmission lines 110 and 109 at connection nodes 134 and 133, respectively, and the drains of $M_2$ and $M_3$ are coupled together. The source of $M_1$ is coupled with the drains of $M_2$ and $M_3$ and the drain of $M_1$ is coupled with a ground source.

This embodiment includes matching network 300 and LC tank network 302 at the end of the IF transmission lines 109 and 110. These networks 300 and 302 can be implemented with any of the embodiments of mixer 100 described herein, including both the differential and single-ended embodiments. These networks 300 and 302 are also preferably capable of monolithic integration with the other components of mixer 100 on the same common substrate 150.

Matching network 300 provides a matched load at the end of the transmission lines 109 and 110 to minimize signal reflections therefrom. LC tank network 302 is preferably configured with an appropriate center frequency to extract the desired IF frequency and filter out any IF harmonics. The use of matching network 300 and LC tank network 302 allows mixer 100 to achieve higher LO-IF and LO-RF isolation. These two networks 300 and 302 will be discussed in more detail below with respect to FIG. 4.

Figure 5:
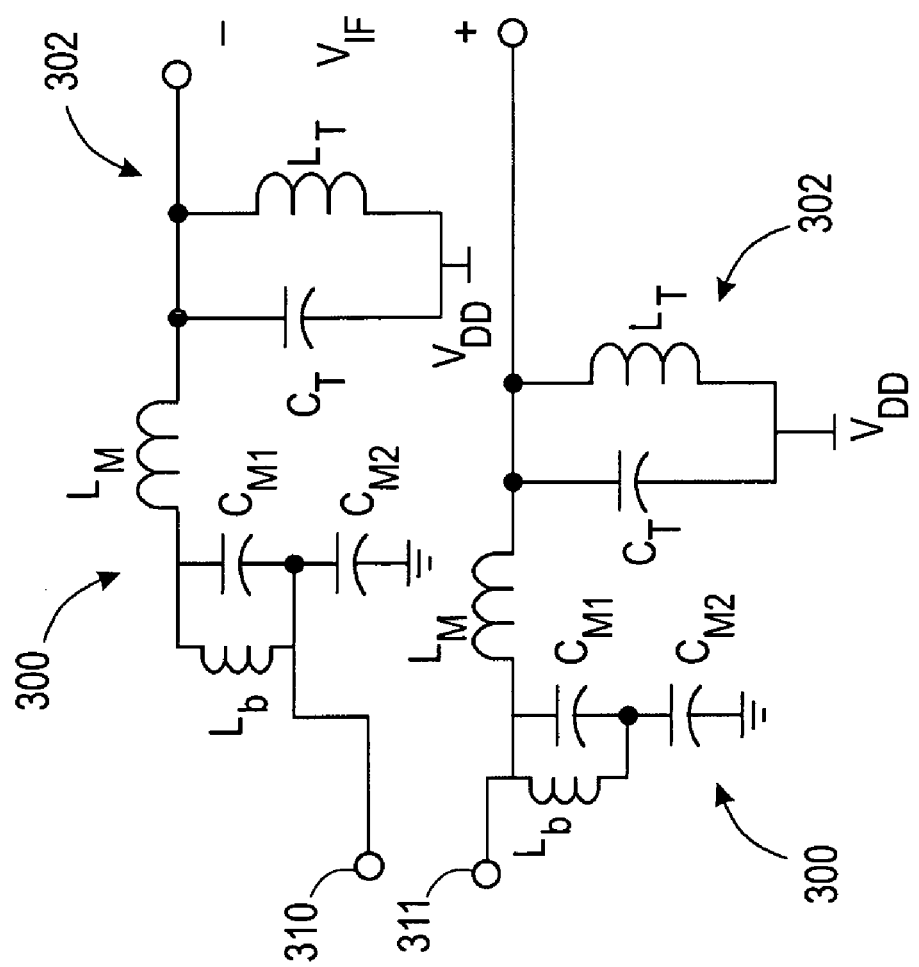
FIG. 5 is a schematic view of exemplary embodiments of a matching network and an LC tank network.

Termination loads 154 and 155 of IF transmission lines 109 and 110 can be coupled with DC voltage source 123 similar to the embodiments depicted in FIGS. 1-2, or with ground, in which case the DC voltage can be provided via LC tank network 302 as depicted in FIG. 5. In either embodiment, the DC voltage travels through transmission lines 109 and 110 and biases each stage 102. This contributes an additional DC current component that adds to the total DC current consumption by all single-balanced stages 102. Mixer 100 can consume more DC power than a conventional mixer when multiple single-balanced stages 102 are used in the distributed architecture, and due to a large DC current drawn by IF transmission lines 109 and 110. Increasing the characteristic impedance of the IF transmission lines 109 and 110 results in a decrease in the amount of current flowing through the lines 109 and 110, and consequently, mixer 100 can achieve less DC power dissipation.

Figure 4:
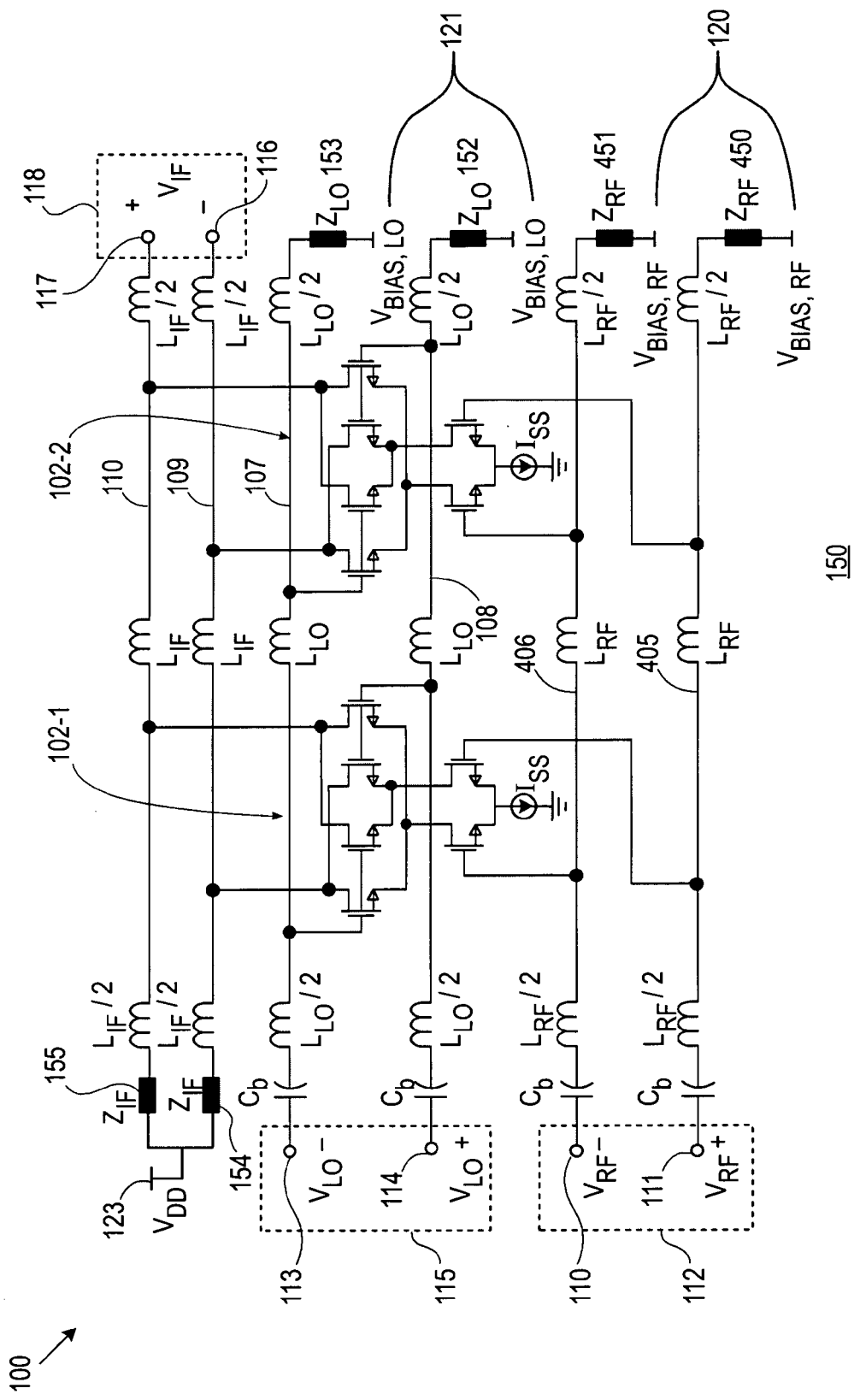
FIG. 4 is a schematic view of an exemplary embodiment of a two stage differential mixer with double-balanced mixer stages.

FIG. 4 depicts an exemplary embodiment of mixer 100 having two double-balanced mixer stages 102. Here, the RF signal as well as the IF and LO signals are differential, with the differential RF signals being provided on transmission lines 405 and 406, each terminated with matched loads 450 and 451, respectively. As in the previous embodiments, this embodiment of mixer 100 is preferably integrated together on common semiconductor substrate 150.

When fabricating mixer 100 each transmission line is preferably artificially realized using LC ladder networks, as depicted in FIG. 4. Specifically, the inductive portion of the LC ladder network can be formed with series connections of spiral or polygonal inductors $L_{RF}$, $L_{LO}$ and $L_{RF}$, and the capacitive portion is formed with the parasitic capacitances of each transistor coupled with the respective transmission line. The artificial transmission line has a characteristic impedance which is generally constant over a wide range of frequencies. The use of LC ladder networks also facilitates the design and implementation of mixer 100.

The operation of mixer 100 is now discussed in further detail with respect to an embodiment of mixer 100 having N single-balanced stages 102 along the RF, LO and IF transmission lines 106-110, similar to the embodiment depicted in FIG. 3. The RF transmission line 106 along with the gate capacitances of the RF current tail $M_1$ of each single-balanced stage 102 is modeled as a new transmission line whose characteristic impedance and propagation constant are as follows:

$$Z_{RF,c} \approx \sqrt{(j\omega l_{RF} + r_{RF}) \Big/ \Big[ j\omega \Big( c_{RF} + \frac{C_{in}}{l_{RF}} \Big) + g_{RF} \Big]} \quad (1)$$

$$\gamma_{RF,c} \approx \Big[ (j\omega l_{RF} + r_{RF}) \Big[ j\omega \Big( c_{RF} + \frac{C_{in}}{l_{RF}} \Big) + g_{RF} \Big] \Big]^{1/2} \quad (2)$$

The above observation is similarly applied to IF Transmission lines 109 and 110 connected at connection nodes 133 and 134 of the single-balanced stages 102, as well as the LO transmission lines 107 and 108 connected at connection nodes 131 and 132. More specifically, each IF transmission line 109 and 110 loaded by the output capacitances of the switching transistors of single-balanced stages 102 is modeled as a new transmission line with the characteristic impedance of $$Z_{IF,c}^{(k)}$$

and the propagation constant of $$\gamma_{IF,c}^{(k)} (k = 1, 2),$$

whose values are determined using equations similar to (1) and (2) except that $C_{in}$ is replaced with $C_{out}$. Similarly, LO transmission lines 107 and 108 loaded by the input capacitances of the differential pair $M_2$ and $M_3$ are modeled as new transmission lines with characteristic impedance of $$Z_{LO,c}^{(k)}$$

and the propagation constant of $$\gamma_{LO,c}^{(k)} (k = 1, 2).$$

The RF voltage, $V_{RF}$, across input terminal 112 of RF transmission line 106 propagates through line 106. The traveling voltage wave at each connection node 130 along transmission line 106 appears as the gate voltage to the current tail $M_1$ of each differential pair $M_2$ and $M_3$, producing a current proportional to $V_{RF}$. A wave reflection occurs at node 130 along RF line 106 because of the impedance mismatch between the characteristic impedance of line 106 and the input impedance of $M_1$. Each connection node 130-134 can optionally be formed using a contact between a metal layer and a substrate bulk that produces a small amount of reflection. The wave reflection at each connection node 130-134 can thus be considered negligible. The voltage across the gate terminal of each current tail $M_1$ then produces the small-signal current at the drain of $M_1$. To avoid the unnecessary complication of carrying the sinusoidal expressions in the analysis, the phasor notation is employed to derive the analytical model. The RF current phasor of the nth current tail $M_1$ at the nth single-balanced stage 102 along line 106 is:

$$I_{\omega RF,n} = g_{mn3} V_{RF} e^{(n-\frac{1}{2}) \gamma RF,c l_{RF,c}} \quad n = 1, \dots, N \quad (3)$$

where $g_{mn,3}$ is the transconductance of current tail transistor $M_1$ and $l_{RF,c}$ represents the length of a segment of RF transmission line 106 between two adjacent stages 102, as shown in FIGS. 1-3. Finally, RF transmission line 106 is terminated with a matched resistive load (not shown) to minimize wave reflections from the termination back into line 106.

Differential pair, or switch-pair, transistors $M_2$ and $M_3$ are driven by a large signal LO voltage. Since a large LO signal is applied to transistors $M_2$ and $M_3$, the bias point of $M_2$ and $M_3$ is not fixed but varies periodically. The output current of each single-balanced stage 102 is a function of the instantaneous LO voltage, $V_{LO}$, and the current, is, at the output of $M_1$. In the time domain, the delayed version of the LO signal applies to transistors $M_2$ and $M_3$ in each single-balanced stage 102, and similarly, the delayed version of the RF voltage applies to current tail transistor $M_1$ of each stage 102. Assuming the propagation delays of RF and LO line segments between any connection nodes 130 and 131-132 to be $T_{RF}$ and $T_{LO}$, respectively, the differential current at the output of the nth stage is:

$$i_{o,n}(t) = p_1 \Big( t - \Big( n + \frac{1}{2} \Big) T_{LO} \Big) \cdot i_{RF,n} \Big( t - \Big( n + \frac{1}{2} \Big) T_{RF} \Big) \quad n = 1, \dots, N \quad (4)$$

where $p_1(t)$ is a periodic waveform running at the LO frequency $f_{LO}$. The value of $p_1(t)$ represents the instantaneous current gain of each single-balanced stage 102, and is expressed in terms of the instantaneous transconductances of transistors $M_2$ and $M_3$:

$$p_1(t) = \frac{g_{m1}(t) - g_{m2}(t)}{g_{m1}(t) + g_{m2}(t)} \quad (5)$$

The current gain $p_1(t)$ only contains the odd harmonics due to the differential architecture of each single-balanced stage 102. The drain current flowing through each branch of $M_2$ and $M_3$ arrives at connection node 133 and 134 of the corresponding IF transmission line 109 and 110, and is equally divided into two current components. As discussed above, each current component travels in an opposite direction along IF lines 109 and 110. Therefore, the forward-traveling current wave at the output of the $n^{th}$ stage is:

$$i_{IF,n}(t) = \frac{i_{RF,n}\Big( t - \Big( n + \frac{1}{2} \Big) T_{RF} \Big)}{2} p_1 \Big( t - \Big( n + \frac{1}{2} \Big) T_{LO} \Big) \quad (6)$$

The current component traveling in the backward direction is absorbed by the matched impedance $Z_{IF,c}$, whereas the other current component propagates toward LC tank network 302. One embodiment of matching network 300 and LC tank network 302 is depicted in FIG. 5. In this embodiment, each transmission line 109 and 110 is coupled with similar individual networks 300 and 302. As stated above, each LC tank network 302 can be matched to IF transmission lines 109 and 110 with matching networks 300.

Matching network 300 is preferably designed so as to transform the small-valued characteristic impedance, $Z_{IF}$, of IF transmission lines 109 and 110 to a large-valued parallel resistance RT (not shown) of LC tank network 302. As a design consideration, matching network 300 preferably does not detune the center frequency of LC tank network 302. In addition, the values of the components of each network 300 and 302 are preferably within a reasonable range for monolithic integration.

To satisfy these design considerations, each embodiment of matching network 300 depicted in FIG. 5 is configured as a passive tapped capacitor resonator consisting of $L_M$, $C_{M1}$ and $C_{M2}$. The inductor $L_M$ cancels out the imaginary part of LC tank network 302 caused by resistive loss of the spiral inductor. The two capacitors $C_{M1}$ and $C_{M2}$ are used as an impedance transformer that transforms the equivalent parallel resistance of LC tank network 302, $R_T$, to the characteristic impedance $Z_{IF,c}$. One advantage of using a passive tapped capacitor resonator is that the series combination of $C_{M1}$ and $C_{M2}$ appears in parallel with $C_T$, which is negligible, and does not change the tuned frequency of LC tank network 302.

Referring back to mixer stages 102, the large amplitude of the LO signal at the input of each single-balanced stage 102 causes the periodic current gain $p_1(t)$ to become roughly a trapezoidal waveform containing the odd harmonics of fundamental frequency $f_{LO}$. According to Eq. (4), $i_{IF,n}$ consists of the IF frequency component and other components located at the frequencies $(2m+1)f_{LO} \pm (2k+1)f_{RF}$ where m and k are integers. This arises from the multiplication of the components of $p_1(t)$ at the harmonics of LO and RF. The current wave travels toward IF output terminal 118. With a sufficiently large LO amplitude, the Fourier series coefficient of the fundamental frequency component of the current waveform at outputs 143 and 144 of each single-balanced stage 102 is approximated as:

$$p_{11} \cong \frac{2}{\pi} \left( \frac{\sin(\pi \Delta f_{LO})}{\pi \Delta f_{LO}} \right) \quad (7)$$

Where $\pi \Delta f_{LO} = \arcsin(V_x/V_{LO})$, and $V_x$ is the maximum differential input that guarantees the switch-pair conducting transistor $M_2$ and $M_3$ to remain in the saturation region for the entire switching interval.

Also, for a sinusoidal LO signal, $\pi f_{LO} = \arcsin(V_x/V_o)$, where $V_O$ is the maximum amplitude of the LO signal. The input LO voltage will likely, however, travel through the LO transmission lines 107 and 108 before reaching inputs 141 and 142 of each mixer stage 102. Thus, both the phase and amplitude of the LO signal are changed while the LO signal is traveling down the lines 107 and 108. As a result, $p_{11}$ becomes a function of the propagation constant of the LO transmission lines 109 and 110. More specifically, the fundamental component of the current gain, $p_1(t)$, for the $n^{th}$ mixer stage 102 is written as:

$$p_{11,n} = \frac{2}{\pi} \frac{V_x / \left( V_o e^{-(n-\frac{1}{2})\alpha_{LO}} \right)}{\arcsin\left( V_x / \left( V_o e^{-(n-\frac{1}{2})\alpha_{LO}} \right) \right)} e^{-j(n-\frac{1}{2})\beta_{LO}} \quad (8)$$

where $\alpha_{LO}$ and $\beta_{LO}$ are the attenuation and phase constant of LO transmission lines 107 and 108, respectively. The attenuation constant of the lines 107 and 108 is as follows:

$$\alpha_{LO} = \frac{(\omega_C/\omega_{gLO})X_{LO}^2}{\sqrt{1 - \left[1 - \left(\frac{\omega_C}{\omega_{gLO}}\right)^2\right]X_{LO}^2}} \quad (9)$$

where $X_{LO} = \omega_{LO}/\omega_C$ is the normalized LO frequency and $\omega_{gLO} = 1/r_{gLO}C_{gsLO}$ is the gate cutoff frequency of the $M_2$ and $M_3$. Eq. (9) indicates that the attenuation constant of LO transmission lines 107 and 108 is a function of the LO frequency. For UWB applications where the LO frequency varies over a wide range of frequencies, consideration should be given to the variation of $\alpha_{LO}$ and its effect on the gain of $M_2$ and $M_3$, $p_{11,n}$. As will be shown in FIGS. 7A-B, the gain of the switching pair is almost invariant for wide range of LO signal frequencies.

Figure 6A:
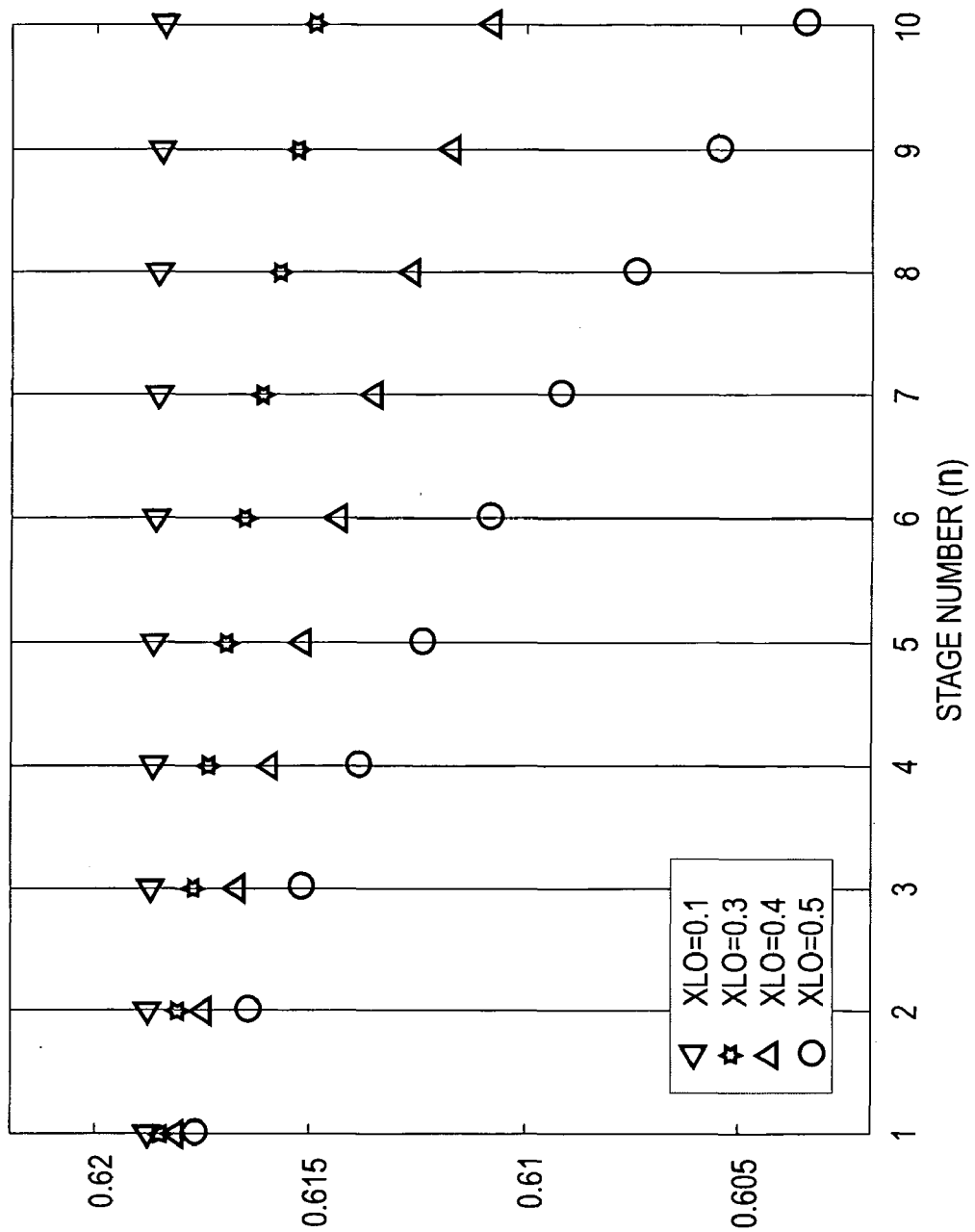
FIGS. 6A-B are graphs of the gain of the differential pair of transistors and the stage number for different LO frequencies in another embodiment of a differential N-stage mixer.
Figure 6B:
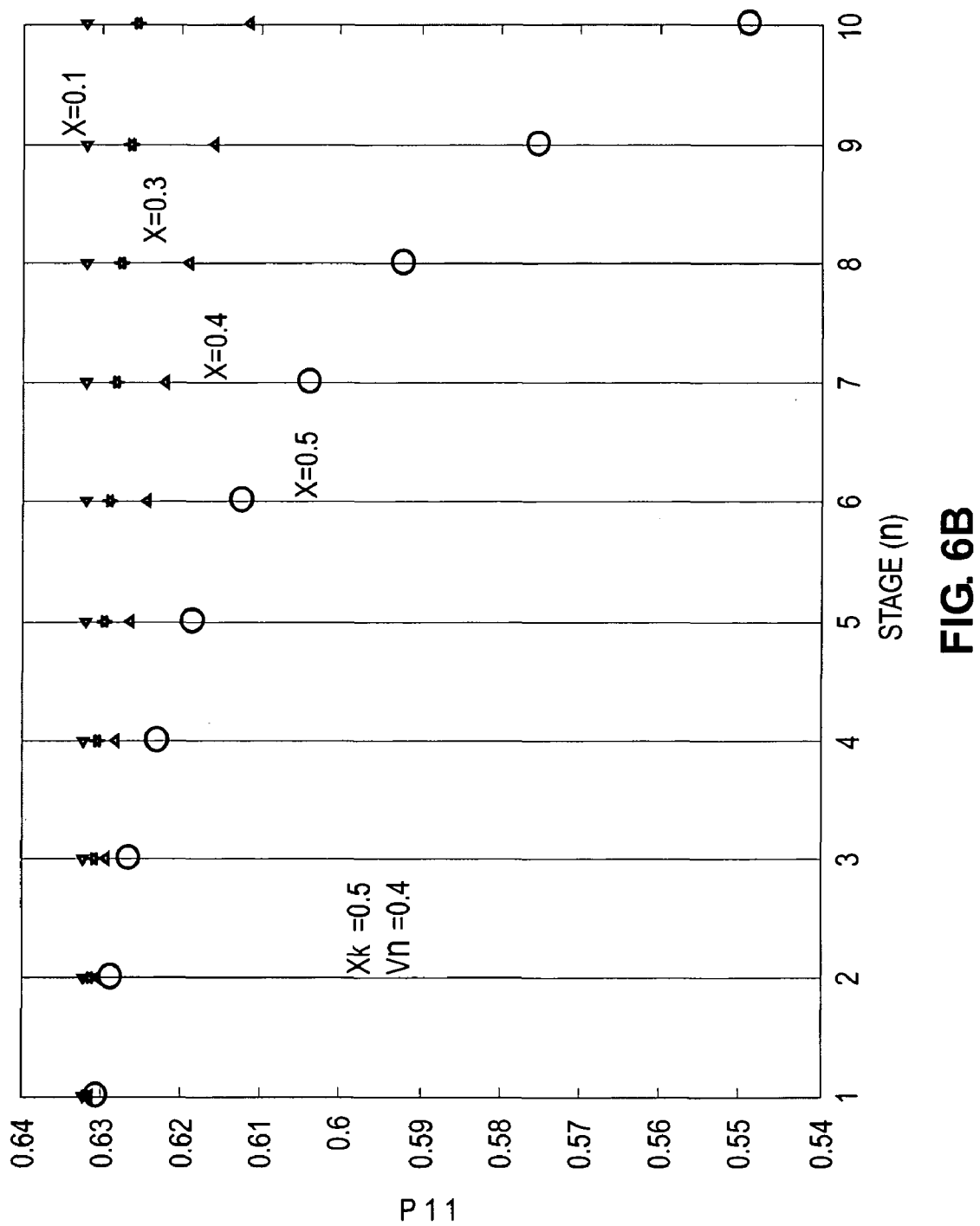

FIGS. 6A-B depict variations of $p_{11,n}$ with respect to the stage number for two values of $X_n = \omega_C/\omega_{gLO}$ ($X_n = 0.1$ and 0.5). In this exemplary embodiment, the number of stages is ten (n=10). As seen in these figures, $p_{11}$ varies less than 8% from the first mixer stage 102-1 to the last stage 102-10, when the LO frequency varies between zero and $\omega_C/2$. The maximum discrepancy in $p_{11,n}$ over this frequency range occurs when $\omega_{LO} = 0.5\omega_C$. This implies that the gain of the differential pair transistors $M_2$ and $M_3$ is very similar for different stages 102 and for a wide range of LO frequencies, despite the fact that the LO signal is attenuated along the transmission lines 107 and 108.

Figure 7A:
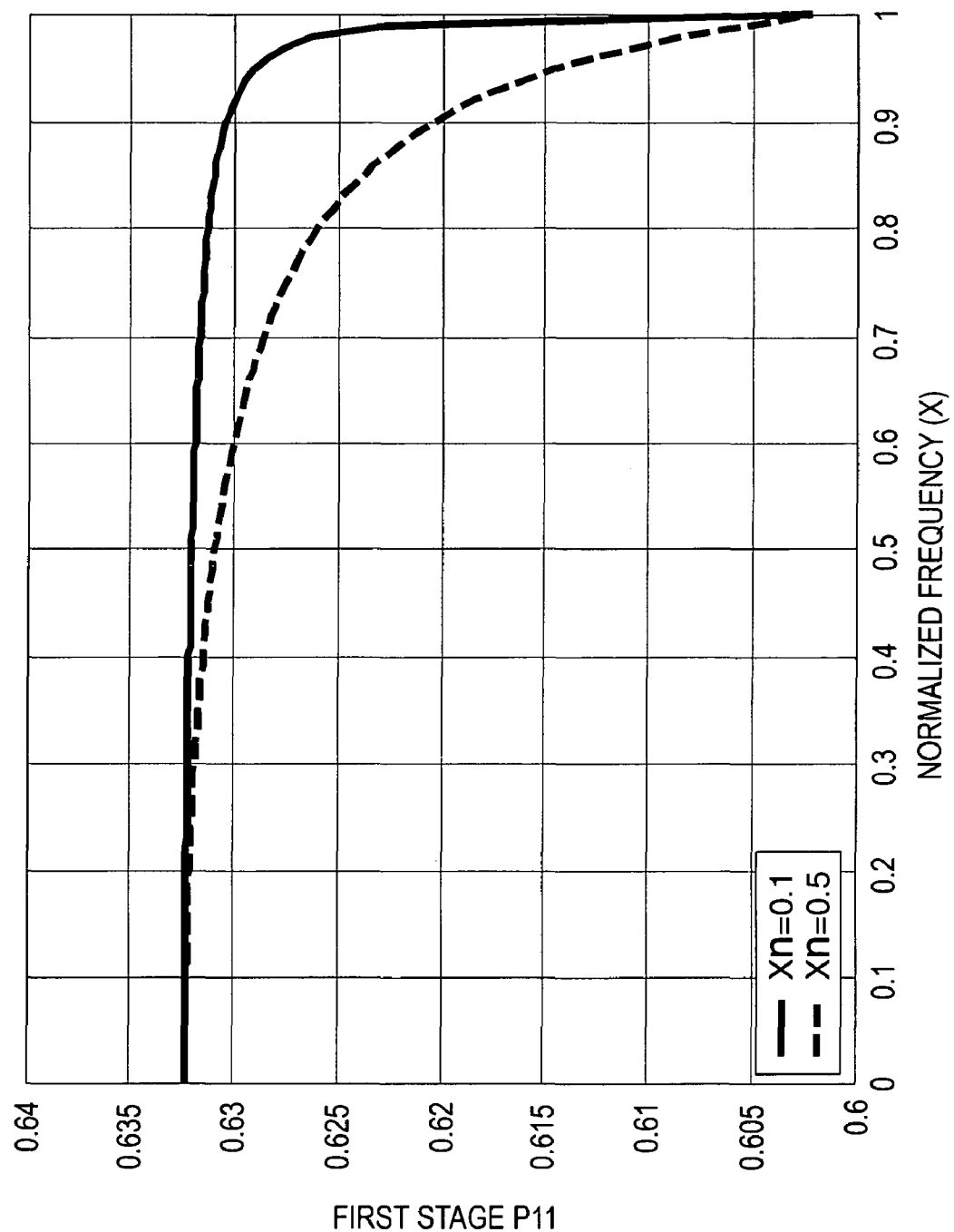
FIGS. 7A-B are graphs of the frequency behavior of $p_{11}$ for the first and last mixer cells of the exemplary embodiment of FIGS. 6A-B.
Figure 7B:
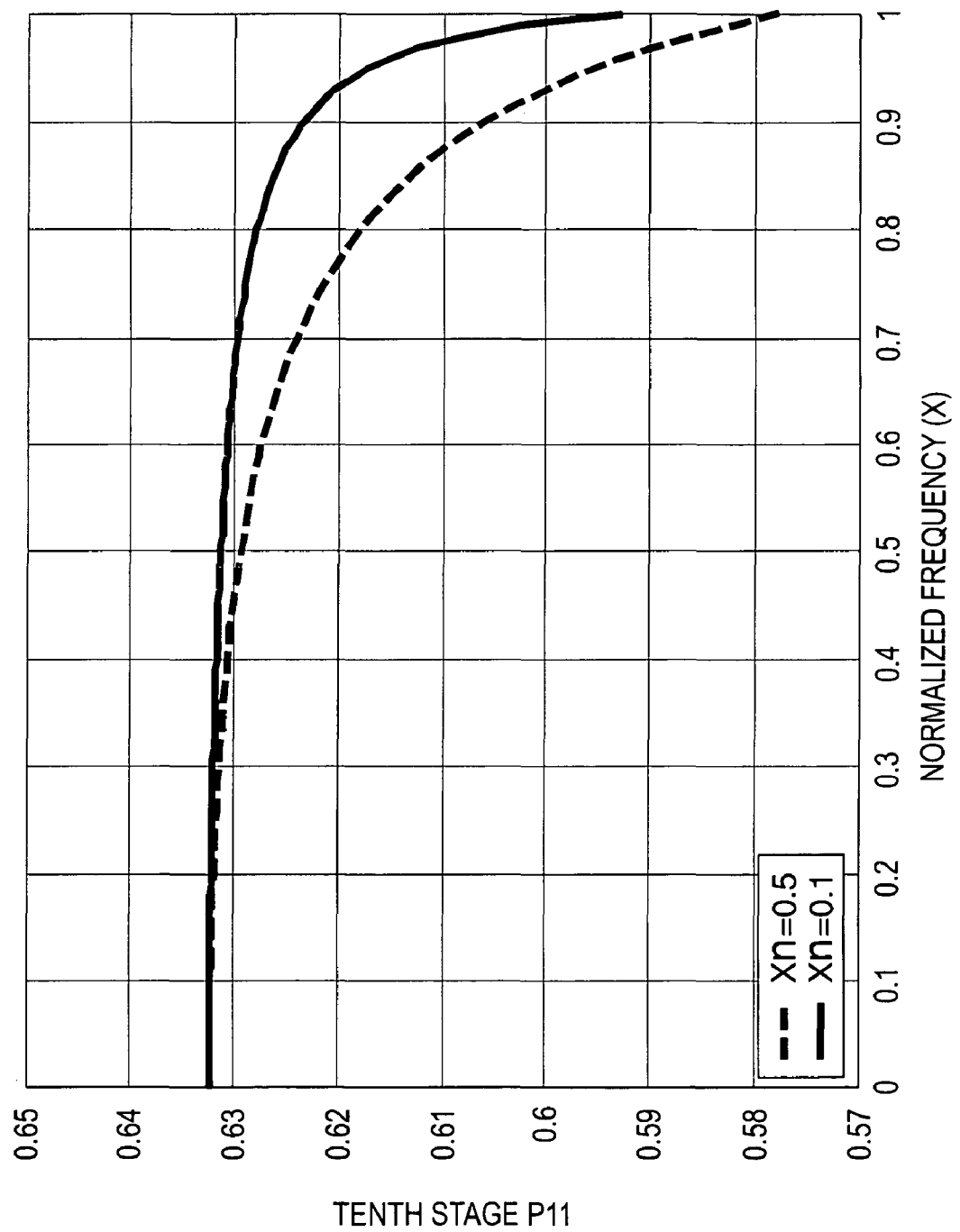

As shown in FIGS. 6A-B, $p_{11,n}$ monotonically decreases as n increases. Thus, any frequency-domain analysis of $|p_{11,n}|$ is carried out only for the first and the last mixer stages 102-1 and 102-10, so that $|p_{11,n}|$ for all values of n provide an upper and lower bounds for the gains of intermediate mixer stages 102. FIGS. 7A-B depict the frequency behavior of $|p_{11,n}|$ for the first and the last mixer stages 102-1 and 102-10. As can be seen from these figures, the current gain of $M_2$ and $M_3$ for the last stage 102-10 at $0.5\omega_C$ decreases less than 0.3% from its low frequency value, whereas the current gain of $M_2$ and $M_3$ for the first stage at $0.5\omega_C$ decreases less than 0.15% from its low frequency value. Thus, mixer 100 can be implemented such that the gain of $M_2$ and $M_3$ is substantially identical for all mixer stages and constant over a wide range of LO frequencies. Thus, it can be assumed that $|p_{11,n}| = p_{11}$.

Also of note in FIGS. 7A-B is the high frequency roll-off. The parasitic capacitance $C_p$, located at the drain connections of $M_2$ and $M_3$ with the source connection of $M_1$, contributes to the high frequency roll-off of the conversion gain, because it is not absorbed by the transmission lines 106-110 in the embodiment of mixer 100 depicted in FIG. 3.

Referring back to Eq. (7), by solving the wave equations for IF transmission lines 109 and 110, the time delay turns into the phase delay in the frequency domain. The phasor of the output current at the IF frequency across the input of the passive tapped capacitor of matching network 300 is:

$$I_{\omega_{IF},out} = \frac{1}{4}\sum_{n=1}^{N} g_{mn3} V_{RF} p_{11} e^{-(n-\frac{1}{2})(\gamma_{RF,c} l_{RF} - \gamma_{LO,c} l_{LO})} e^{-(N-n+\frac{1}{2})\gamma_{IF,c} l_{IF}} \quad (10)$$

Where $\gamma_{IF,c}$, $\gamma_{RF,c}$ and $\gamma_{LO,c}$ are the propagation constants of IF, RF, and LO transmission lines 106-110 at IF, RF, and LO frequencies, respectively. The phase-shift of the output current at the IF frequency is the difference between the phase of the RF current and fundamental component of the current gain $p_1(t)$ at the LO frequency. Therefore, for each stage 102 the phase-shift of the output current at the IF frequency is the phase difference between the input RF signal and LO signal to that stage 102. This is shown in Eq. (10). Due to the preferably substantially identical geometry and biasing point of current tail transistors $M_1$, the transconductance of current tail transistors $M_1$ can be substantially identical. Therefore, $g_{mn3} = g_{m3}$ for all $n \in [1, \ldots, N]$.

According to Eq. (10), the signal at ends 310 and 311 of IF transmission lines 109 and 110 contains both the IF frequency as well as other harmonics. The other harmonics are preferably placed out of the frequency band of LC tank 302. Consequently, LC tank 302 acts as a short circuit for the harmonics of the IF frequency and these frequency components are reflected back to the IF Transmission line. Preferably, the only frequency component that is allowed to pass through LC tank 302 is the desired IF signal. For the sake of simplicity we use $\Phi$ as the phase difference. Therefore, we have:

$$\gamma_{RF,c} l_{RF} - \gamma_{LO,c} l_{LO} = \Phi \quad (11)$$

The current phasor at output terminal 118 is obtained as follows:

$$I_{\omega_{IF},out} = \frac{g_{m3} V_{RF}}{4} p_{11} e^{-\frac{(\Phi + \gamma_{IF,c} l_{IF})}{2}} \cdot \frac{e^{-N\gamma_{IF,c} l_{IF}} - e^{-N\Phi}}{e^{-\gamma_{IF,c} l_{IF}} - e^{-\Phi}} \quad (12)$$

The output voltage of LC tank network 302 tuned at the IF frequency is:

$$V_{out} = I_{\omega_{IF},out} R_T \quad (13)$$

where $R_T$ is the equivalent parallel resistance of LC tank network 302. The maximum conversion gain is achieved by differentiating (12) with respect to $\lambda_{IF} l_{IF}$, which results in the following relationship:

$$\gamma_{IF} l_{IF} = \gamma_{RF,c} l_{RF} - \gamma_{LO,c} l_{LO} = \gamma l \quad (14)$$

The real part of the propagation constant contributes to the signal attenuation, and the imaginary part induces phase shift to the signal. Equating imaginary parts in Eq. (14), we have:

$$\beta_{IF} l_{IF} = \beta_{RF} l_{RF} - \beta_{LO} l_{LO} \quad (15)$$

As a well-known fact, the imaginary part of the propagation constant is $\beta = 2\pi f/v$, where f is the frequency and v is the phase velocity. Placing single-balanced stages 102 at substantially equal distances along the transmission lines 106-110 readily yields $l_{RF} = l_{IF} = l_{LO}$, which, in turn, leads to the following relationship between the propagation constants of RF, LO, and IF transmission lines 106-110:

$$\beta_{RF} l - \beta_{LO} l = \frac{2\pi}{v} l(f_{RF} - f_{LO}) = \frac{2\pi}{v} l f_{IF} = \beta_{IF} l \quad (16)$$

Eq. (16) states that by using the same physical geometries for RF, LO, and IF transmission lines 106-110, the wave propagation constant for the IF transmission lines 109 and 110 is equal to the difference between the propagation constants of the RF and LO transmission lines 106-108. Consequently, Eq. (14) holds valid for a wide range of LO and RF frequencies, as well as any given IF frequency.

The conversion gain $A_C$, which is the ratio between the amplitudes of $V_{IF}$ and $V_{RF}$ is calculated from (10) and (14):

$$A_C = \frac{N g_{m3}}{4} p_{11} R_T e^{-\gamma l} \quad (17)$$

In order to achieve optimal conversion gain, the current flowing out of each single-balanced stage 102 to IF transmission lines 109 and 110 at the IF frequency should constructively add up to the current waves flowing out of other stages 102 along the respective line 109 and 110. In the other words, in each stage 102, the forward-traveling current wave at the IF frequency along IF transmission lines 109 and 110 should be in phase with the current coming out the stage 102 at nodes 133 and 134. The phase of the output current of each stage 102 at the IF frequency is preferably equal to the phase difference of the signal in RF transmission line 106 at the RF frequency and the signal in LO transmission lines 107 and 108 at the LO frequency. The maximum conversion gain is achieved when the forward-traveling waves along IF transmission lines 109 and 110 at the IF frequency experience the same propagation delay as the difference in propagation delays between the wave traveling along RF transmission line 106 at RF frequency and the wave traveling along LO transmission lines 107 and 108 at the LO frequency, as is shown by Eq. (14).

As stated above, the output signals of mixer stages 102 in n-stage mixer 100, after traveling toward the output terminal 118, preferably add together linearly at output 118. Consequently, the output signal power is proportional to $n^2$. The output noise power contributed by each stage 102 also linearly adds up with output noise powers contributed by other stages 102 at the output 118 of mixer 100, assuming the noise signals at the outputs 143 and 144 of mixer stages 102 to be mutually independent. Although, the noise figure (NF) can be reduced by a factor of N in mixer 100 compared to conventional single-stage mixers, the existence of matched termination loads 151-155 introduces some additional thermal noise sources to mixer 100 and can increase the NF of mixer 100. However, the contribution of these thermal noise sources on the overall NF can also be divided by a factor of N.

Circuit simulations demonstrate that 3-5 stage embodiments of mixer 100 exhibit a relatively lower NF than embodiments with more or less stages, with 4 stage embodiment exhibiting the lowest NF. Some intrinsic noise sources that should be considered in the design and implementation of mixer 100 include thermal noise from the input source impedance, thermal noise from the RF, LO and IF terminations 151-155 and noise sources associated with each transistor $M_1$-$M_3$ including the thermal noise from rg (the polysilicon gate resistance) and channel noise.

FIGS. 8-11 depict performance results of an exemplary embodiment of mixer 100. These performance results demonstrate the capabilities of mixer 100 but are no way intended to limit the design or operating parameters of mixer 100. In fact, mixer 100 is capable of performance exceeding that depicted in FIGS. 8-11. These performance results were obtained with an exemplary two-stage single-balanced distributed mixer 100, designed and fabricated in standard 0.18 μm CMOS process. A 1.8 volt (V) supply voltage was used in the design. The 1.8-V power supply draws 6 milliamps (mA) of DC current.

Figure 8:
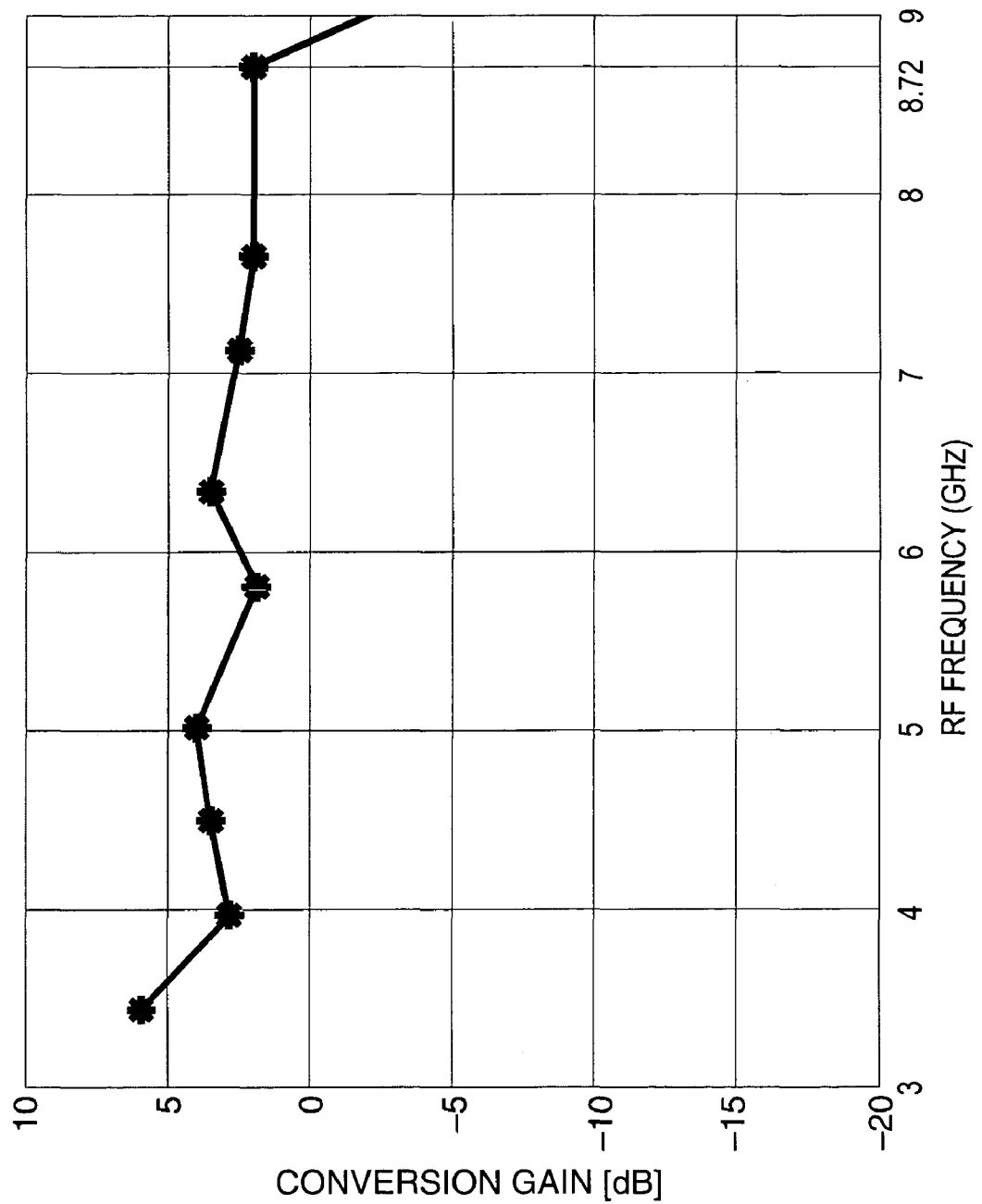
FIG. 8 is a graph of the conversion gain versus RF frequency in an exemplary embodiment of a two stage differential mixer.

In the first experiment, the conversion gain of the proposed mixer is measured for an IF frequency of 528 Megahertz (MHz). The LO and RF signal amplitudes are −3 decibel milliwatts (dBm) and 9 dBm, respectively. An HP 11667c power splitter with 6 dB of power-loss has been employed to produce the differential input for the LO signal. One of the IF outputs is terminated to the 50 watt (W) load, and the other one is connected to the spectrum analyzer Agilent 8565. The single ended IF output was measured using a correction factor of 6 decibels (dB) to account for the 6 dB gain increase of the differential conversion gain. FIG. 8 depicts the conversion gain with respect to the RF frequency. As depicted in this figure, the conversion gain exhibits a 3 dB variation across the 3-8.72 GHz range of input frequencies. The average conversion gain is around 3.0 dB.

Figure 9:
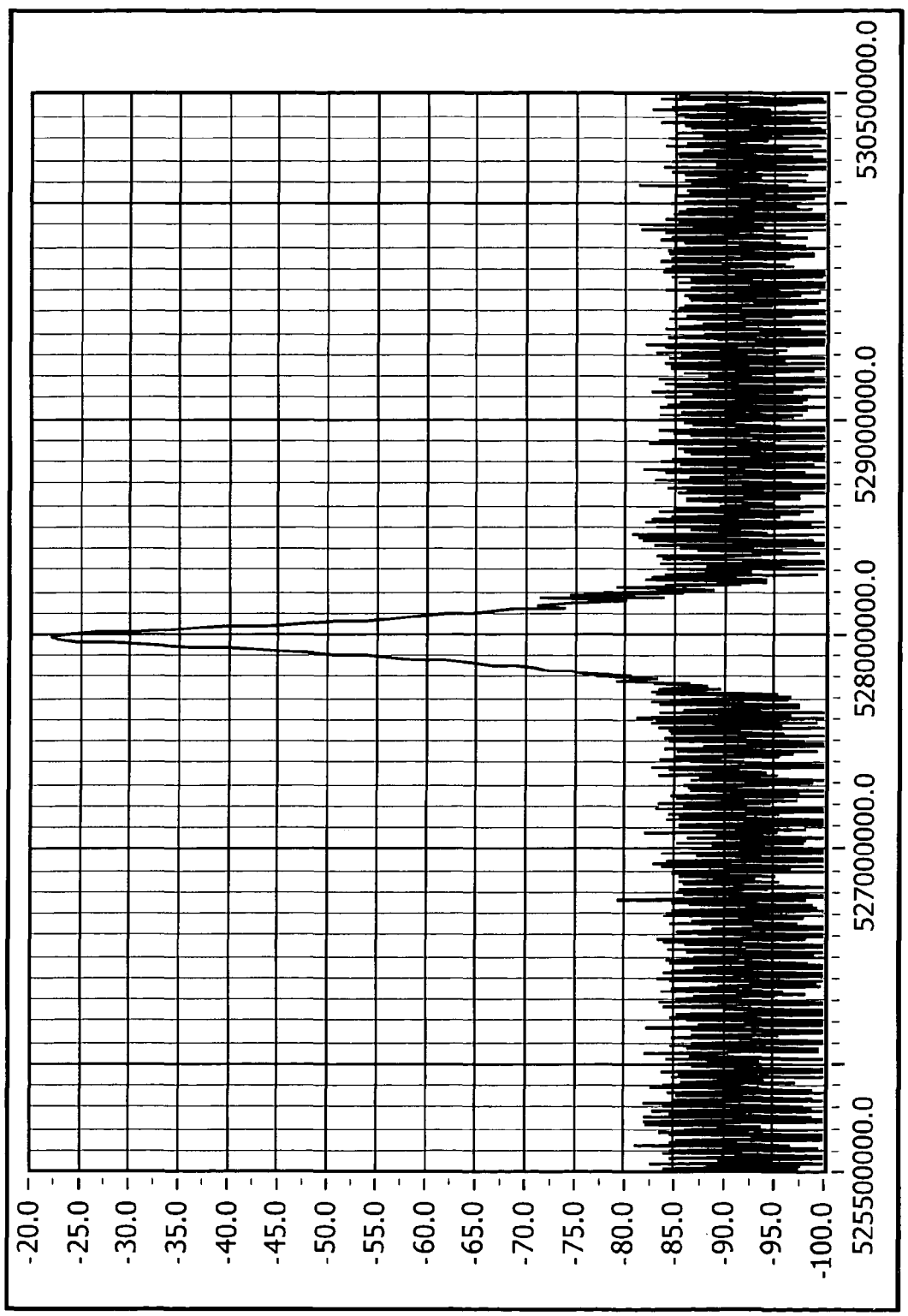
FIG. 9 is a graph of the spectrum analyzer output for a specified RF value and RF power in the exemplary embodiment of a two stage differential mixer of FIG. 8.
Figure 10:
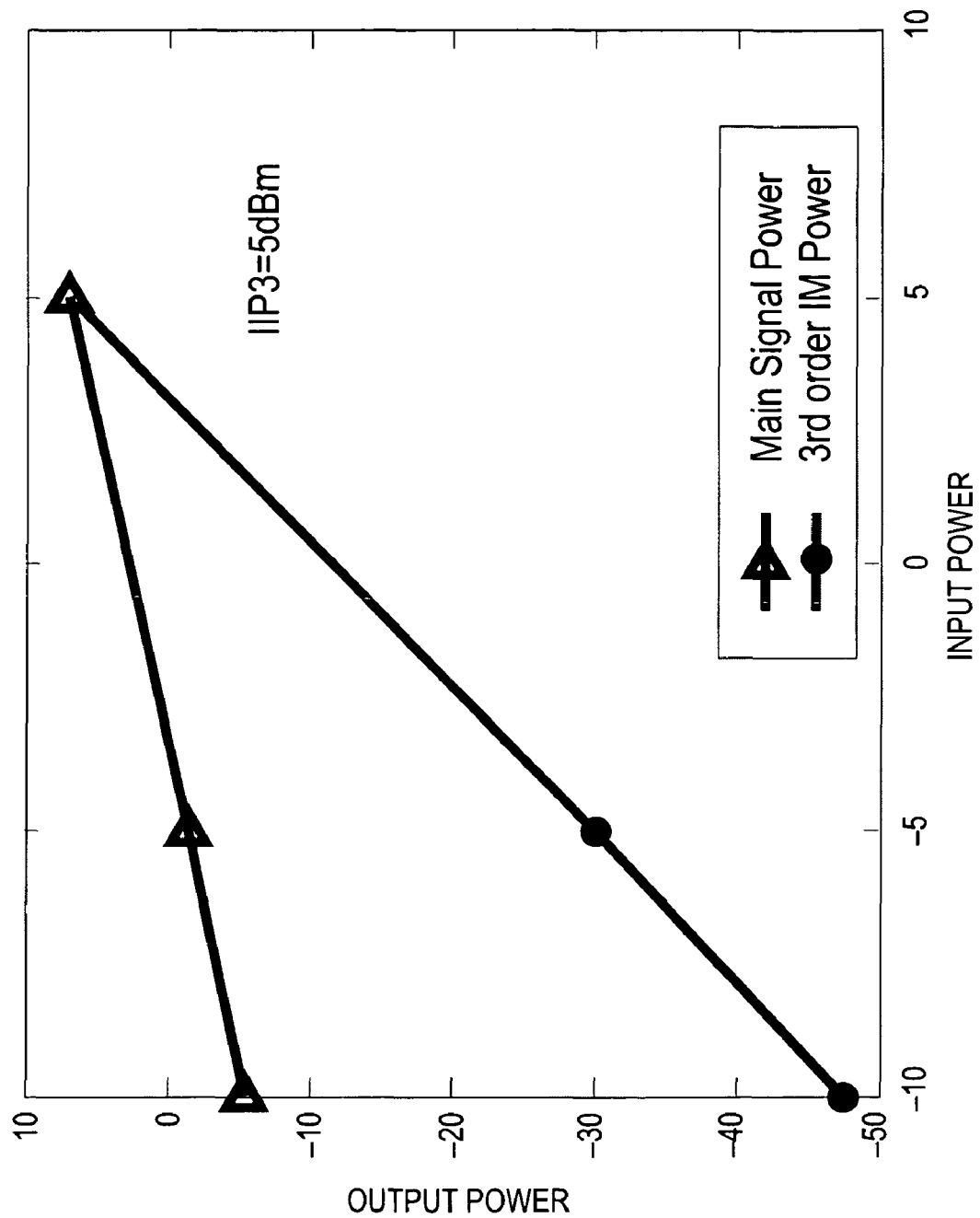
FIG. 10 is a graph of the measured two tone test for a given RF and LO value in the exemplary embodiment of a two stage differential mixer of FIG. 8.
Figure 11:
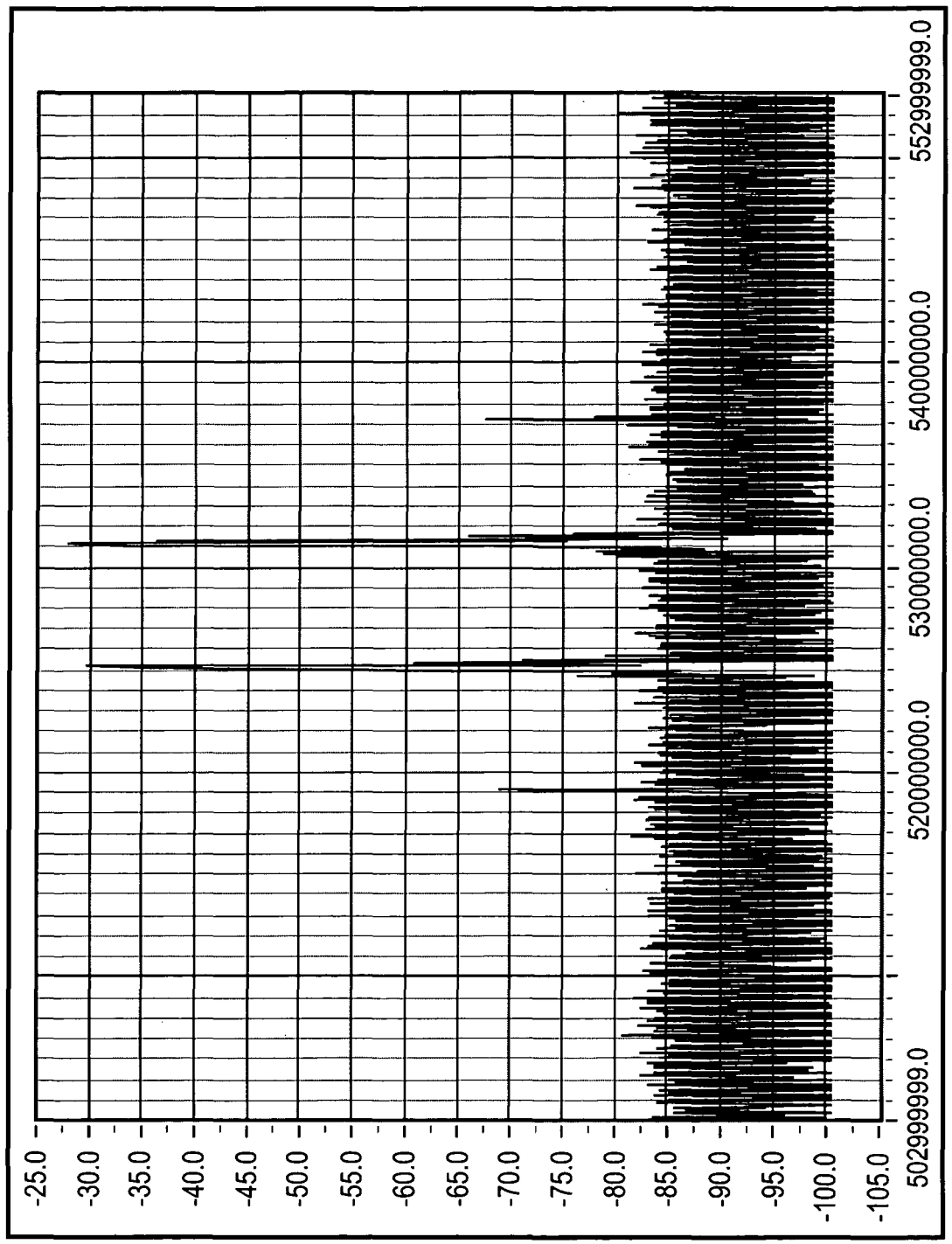
FIG. 11 is a graph of the spectrum analyzer output for two specified RF values and a specified RF power in the exemplary embodiment of a two stage differential mixer of FIG. 8.

FIG. 9 depicts the output of the spectrum analyzer for the RF frequency of 8.712 GHz. The RF input power was set to −20 dBm. FIG. 10 depicts the result of a two-tone test for mixer 100 at the RF frequency of 5.016 GHz and the LO frequency of 4.488 GHz. The IIP3 value, or the input level at which the $3^{rd}$ order two-tone distortion products are equal in power to the desired signals, is 5.0 dBm. For this measurement, two RF input signals, one at 5.013 GHz and the other at 5.019 GHz, are fed to input RF port. FIG. 11 depicts the output of the spectrum analyzer for an RF input power of 10 dBm and RF frequencies of 5.013 GHz and 5.019 GHz.

Figure 12:
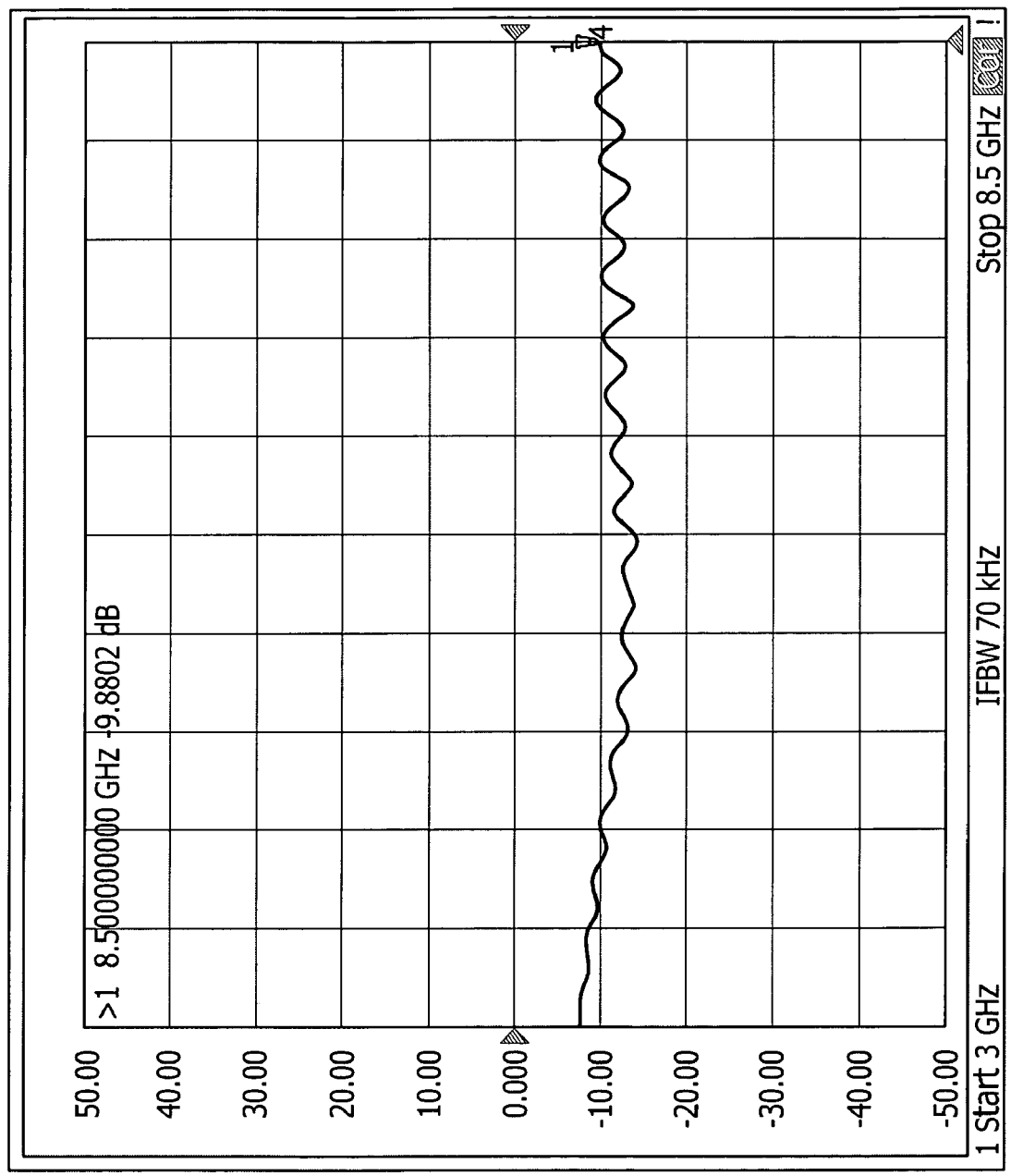
FIG. 12 is a graph of the magnitude of input reflection coefficient in the exemplary embodiment of a two stage differential mixer of FIG. 8.

The s-parameter was also measured to demonstrate the matching performance of the proposed mixer. The Agilent E5071A network analyzer with a maximum frequency bandwidth of 8.5 GHz was used for measuring the input reflection coefficient, $s_{11}$. All other output terminals were terminated to 50 W line impedance. The measurement result of the magnitude response of $s_{11}$ is depicted in FIG. 12. Here, $s_{11}$ exhibits a flat response of −10 dB over the entire 3-8.5 GHz range. Mixer 100 also exhibits very good sensitivity to the LO variation. The measurements show that if the LO signal varies from 9 dBm to 20 dBm, the conversion gain varies only by 1.5 dB.

While the invention is susceptible to various modifications and alternative forms, a specific example thereof has been shown in the drawings and is herein described in detail. It should be understood, however, that the invention is not to be limited to the particular form disclosed, but to the contrary, the invention is to cover all modifications, equivalents, and alternatives falling within the spirit of the disclosure. Furthermore, it should also be understood that the features or characteristics of any embodiment described or depicted herein can be combined, mixed or exchanged with any other embodiment.

What is claimed is:

1. A distributed complementary metal-oxide-semiconductor (CMOS) mixer, comprising: a plurality of CMOS mixer stages, each configured to mix a radio frequency (RF) signal with a local oscillator (LO) signal and output a mixed intermediate frequency (IF) signal, wherein each mixer stage is a single-balanced or double-balanced current commuting mixer, and wherein the mixed IF signal is generated by multiplying the RF signal by the LO signal; and a plurality of monolithic transmission lines configured to provide the RF and LO signals to each stage and output the mixed IF signal from each stage, wherein each of the plurality of monolithic transmission lines is of equal length and wherein each transmission line comprises a plurality of connection nodes at different locations, each connection node coupling the respective transmission line to a different mixer stage, and wherein each monolithic transmission line of the plurality of monolithic transmission lines provides wideband matching; wherein the mixer stages and monolithic transmission lines are integrated on a common semiconductor substrate, and wherein each monolithic transmission line of the plurality of monolithic transmission lines is one of a coplanar waveguide and a multistage ladder LC network; wherein the plurality of monolithic transmission lines includes: a first and a second monolithic transmission line coupled with a differential RF input to each stage at a first and a second connection node, respectively; a third and a fourth monolithic transmission line coupled with a differential LO input to each stage at a third and a fourth connection node, respectively; and a fifth and a sixth monolithic transmission line coupled with a differential IF output of each stage at a fifth and a sixth connection node, respectively, for outputting the mixed IF signal from each stage, the fifth and sixth monolithic transmission lines also coupled with a differential IF output terminal; wherein each mixer stage comprises: a first field-effect transistor having a first gate, a first drain and a first source, wherein the first gate is coupled with the fourth connection node; a second field-effect transistor having a second gate, a second drain and a second source, wherein the second gate is coupled with the first gate; a third field-effect transistor having a third gate, a third drain and a third source, wherein the third source is coupled with the first source and the sixth connection node; a fourth field-effect transistor having a fourth gate, a fourth drain and a fourth source, wherein the fourth gate is coupled with the third connection node and the third gate, and the fourth source is coupled with the second source and the fifth connection node; a fifth field-effect transistor having a fifth gate, a fifth drain and a fifth source, wherein the fifth gate is coupled with the second connection node, and the fifth source is coupled with the first drain and the fourth drain; and a sixth field-effect transistor having a sixth gate, a sixth drain and a sixth source, wherein the sixth gate is coupled with the first connection node, the sixth source is coupled with the second drain and the third drain, and the sixth drain is coupled with the fifth drain and a reference node.

2. The mixer of claim 1, wherein the length of each transmission line between adjacent connection nodes is predetermined such that the mixed IF signal output from each stage at the respective connection node is substantially in-phase with the mixed IF output signal propagating from any preceding stage to constructively add with the mixed IF output signal propagating from any preceding stage.

3. The mixer of claim 1, wherein the mixed IF output signal is output from the mixer at an IF output terminal and comprises a constructive sum of the IF signals output from each mixer stage.

4. The mixer of claim 3, further comprising a matching network and an LC tank network coupled to the IF output terminal.

5. The mixer of claim 1, further comprising a matching network and an LC tank network coupled between the fifth and sixth transmission lines and the IF output terminal.

6. The mixer of claim 1, configured for use in an ultra wideband (UWB) receiver.

* * * * *